US012787799B2

(12) United States Patent
Karasawa

(10) Patent No.: US 12,787,799 B2
(45) Date of Patent: Nov. 3, 2026

(54) SEMICONDUCTOR MODULE AND MANUFACTURING METHOD THEREFOR

(71) Applicant: FUJI ELECTRIC CO., LTD., Kawasaki (JP)

(72) Inventor: Tatsuya Karasawa, Shiojiri-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 362 days.

(21) Appl. No.: 18/426,032

(22) Filed: Jan. 29, 2024

(65) Prior Publication Data

US 2024/0304525 A1 Sep. 12, 2024

(30) Foreign Application Priority Data

Mar. 7, 2023 (JP) ................................ 2023-034194

(51) Int. Cl.

*H10W 70/40* (2026.01)
*H10W 90/00* (2026.01)

(52) U.S. Cl.

CPC ....... *H10W 70/415* (2026.01); *H10W 70/465* (2026.01); *H10W 90/00* (2026.01); *H10W 90/753* (2026.01); *H10W 90/754* (2026.01); *H10W 90/792* (2026.01); *H10W 90/794* (2026.01)

(58) Field of Classification Search

None
See application file for complete search history.

(56) References Cited

U.S. PATENT DOCUMENTS

2015/0187668 A1 7/2015 Takahashi
2019/0067165 A1* 2/2019 Soda ..................... H10W 20/20
2021/0013141 A1* 1/2021 Nakayama ............ H10W 20/43
2021/0125891 A1* 4/2021 Kajihara ................ H02K 11/33
2021/0358835 A1 11/2021 Inokuchi

FOREIGN PATENT DOCUMENTS

WO 2014/073311 A1 5/2014
WO 2021/029150 A1 2/2021

* cited by examiner

*Primary Examiner* — Khaja Ahmad
(74) *Attorney, Agent, or Firm* — Rabin & Berdo. P.C.

(57) ABSTRACT

A method includes electrically connecting first and second semiconductor elements to conductive plates, respectively, on the front surface of one or more insulating substrates disposed on a metal base; disposing, on the base, a case including a chassis, a first lead frame having a first wiring part extending in a wired direction parallel to the front surface, and a second lead frame having a second wiring part in the wiring direction to overlap the first wiring part with gap that are integrally molded together; and attaching one or more insulating members that include a clamping part sandwiching the first and second wiring parts from the rear surface of the first wiring part and the front surface of the second wiring part in an attachment area thereof and a wiring gap part filling the gap in the attachment area, before joining the lead frames to circuit patterns, respectively.

18 Claims, 13 Drawing Sheets

SEMICONDUCTOR MODULE AND MANUFACTURING METHOD THEREFOR

CROSS-REFERENCE TO RELATED APPLICATION

This application is based upon and claims the benefit of priority of the prior Japanese Patent Application No. 2023-034194, filed on Mar. 7, 2023, the entire contents of which are incorporated herein by reference.

BACKGROUND OF THE INVENTION

1. Field of the Invention

The embodiments discussed herein relate to a semiconductor module and manufacturing method therefor.

2. Background of the Related Art

Some known semiconductor modules are provided with insulating blocks in order to maintain a certain distance or more between two plate-like terminal conductors that overlap in plan view (see, for example, International Publication Pamphlet No. WO 2014/073311). Other known semiconductor modules are equipped with a wiring holding part, which includes a portion filling a gap in where two lead frames overlap each other in plan view, in order to prevent a short circuit between the two lead frames even when the gap is insufficiently filled with a sealing member (see, for example, International Publication Pamphlet No. WO 2021/029150).

SUMMARY OF THE INVENTION

According to an aspect, there is provided a method for manufacturing a semiconductor module, the method including: disposing, on a metal base, one or more insulating substrates each having, on a front surface thereof, a first semiconductor element, a second semiconductor element, a first conductive plate, and a second conductive plate; connecting electrically the first semiconductor element and the second semiconductor element to the first conductive plate and the second conductive plate, respectively; disposing, on the metal base, a case including a first lead frame, a second lead frame, and a frame-like chassis that are integrally molded together, the first lead frame including a first wiring part that extends in parallel to the front surface of the one or more insulating substrates, and the second lead frame including a second wiring part that extends in a wiring direction of the first wiring part in such a manner as to overlap the first wiring part with a gap from a front surface of the first wiring part; joining the first lead frame and the second lead frame to a first circuit pattern and a second circuit pattern, respectively, on the metal base; and attaching, before the joining of the first lead frame and the second lead frame to the first circuit pattern and the second circuit pattern, respectively, one or more insulating members, each including a clamping part and a wiring gap part, to an attachment area provided in part of where the first wiring part and the second wiring part overlap each other, the clamping part sandwiching the first and second wiring parts at the attachment area from a rear surface of the first wiring part and a front surface of the second wiring part, and the wiring gap part filling the gap between the first and second wiring parts in the attachment area.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings.

Note that in the following the terms "front surface" and "top face" refer to the X-Y plane facing upward (the +Z direction) in a semiconductor module 10 and the like of FIGS. 1 and 2. Similarly, the term "upper" refers to the upward direction (the +Z direction) of the illustrated semiconductor module 10 and the like of FIGS. 1 and 2. On the other hand, the terms "rear surface" and "bottom face" refer to the X-Y plane facing downward (the −Z direction) in the illustrated semiconductor module 10 and the like of FIGS. 1 and 2. Similarly, the term "lower" refers to the downward direction (the −Z direction) of the illustrated semiconductor module 10 and the like of FIGS. 1 and 2. These terms have the same orientational relationships in other drawings if needed. The terms "front surface", "top face", "upper", "rear surface", "bottom face", "lower", and "lateral face" are simply expedient expressions used to specify relative positional relationships, and are not intended to limit the technical ideas of the embodiments described herein. For example, the terms "upper" and "lower" do not necessarily imply the vertical direction to the ground surface. That is, the "upper" and "lower" directions are not defined in relation to the direction of the gravitational force.

(a) First Embodiment

Next described are a semiconductor module and a manufacturing method therefor according to a first embodiment, with reference to FIGS. 1 to 9.

Figure 1:
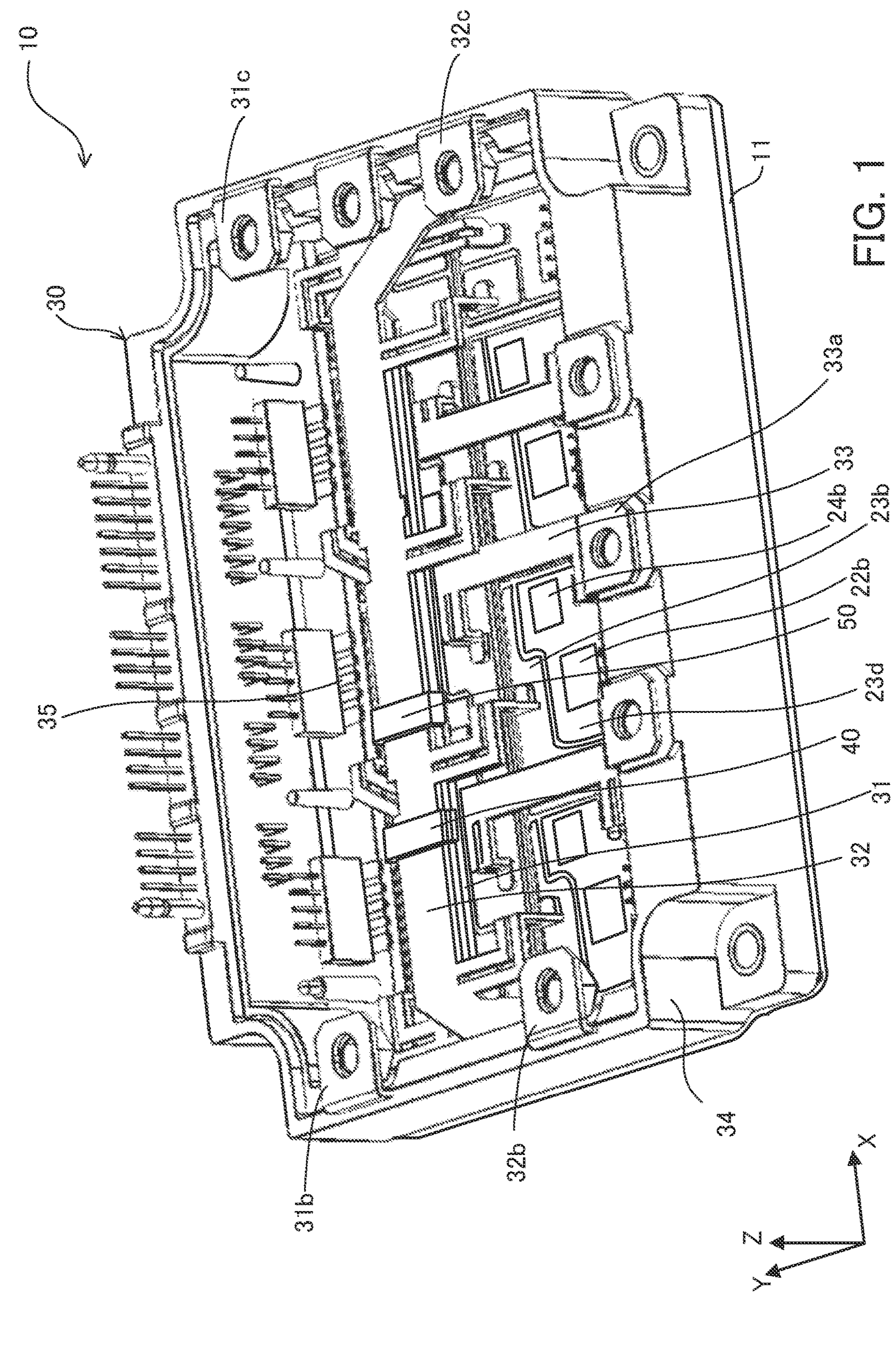
FIG. 1 is a perspective view of a semiconductor module according to a first embodiment.

FIG. 1 is a perspective view of the semiconductor module according to the first embodiment. FIG. 2 is a plan view of the semiconductor module according to the first embodiment.

Figure 2:
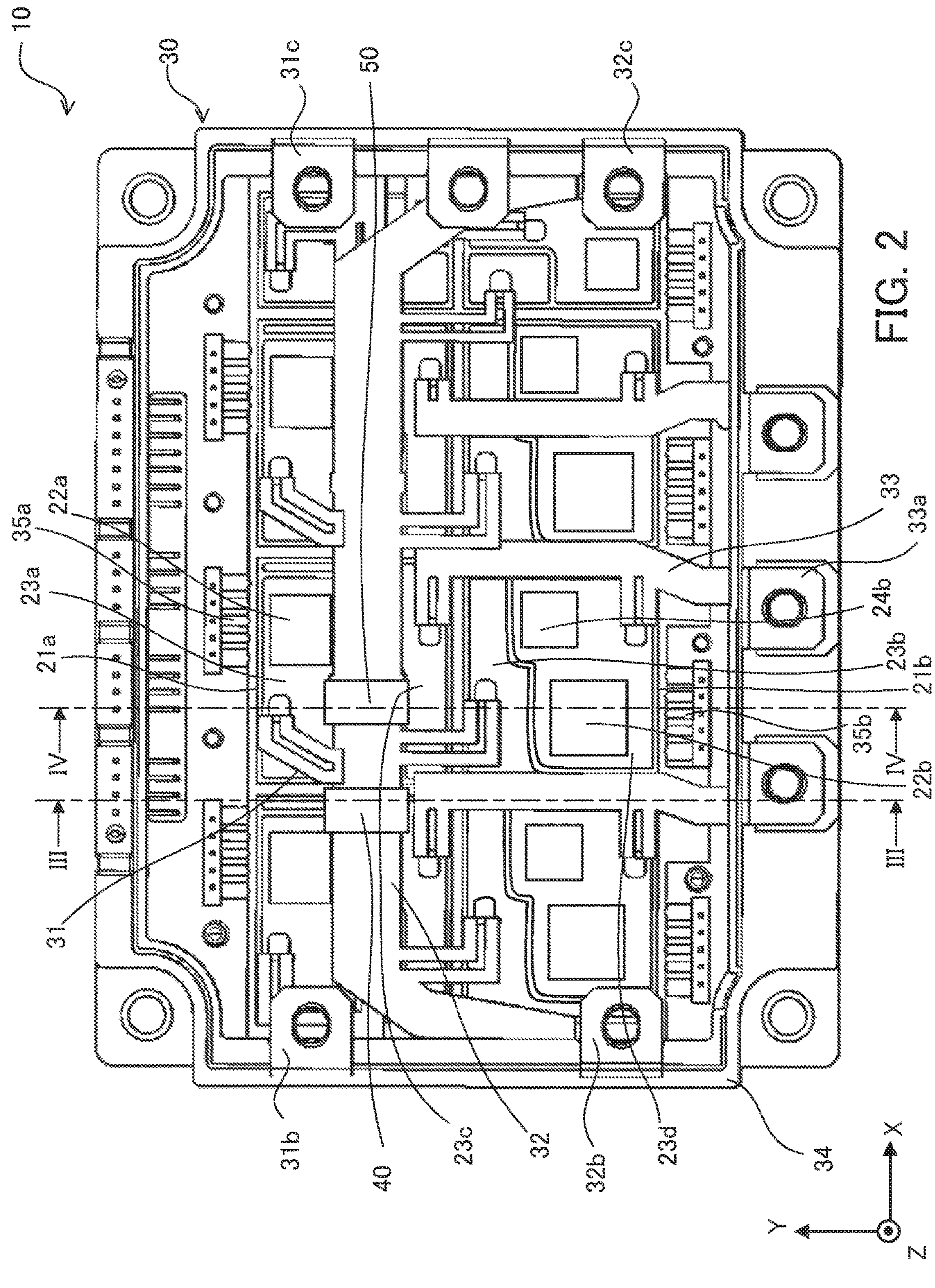
FIG. 2 is a plan view of the semiconductor module according to the first embodiment.

The example of FIGS. 1 and 2 depicts the semiconductor module 10 including functions of a three-phase inverter circuit. The semiconductor module 10 includes a metal base 11, a first insulating substrate 21*a*, a second insulating substrate 21*b*, a case 30, a first insulating member 40, and a second insulating member 50.

The metal base 11 is used for heat dissipation of the semiconductor module 10, and mainly formed of a metal with excellent thermal conductivity. Examples of such a metal are copper, aluminum, and an alloy containing at least one of these metals. Plating may be applied to the metal base 11 in order to provide improved corrosion resistance. In this case, a material used for plating is nickel, a nickel-phosphorus alloy, or a nickel-boron alloy, for example.

The first insulating substrate 21*a* and the second insulating substrate 21*b* are disposed on the metal base 11. The first insulating substrate 21*a* and the second insulating substrate 21*b* are fixed to the metal base 11 by, for example, soldering. The first insulating substrate 21*a* and the second insulating substrate 21*b* are made of ceramics with excellent thermal conductivity. Example of such ceramics are high-temperature conductive aluminum oxide, aluminum nitride, and silicon nitride.

On the front surface of the first insulating substrate 21*a*, a first semiconductor element 22*a* and a first conductive plate 23*a* electrically connected to the first semiconductor element 22*a* are provided, as illustrated in FIG. 2. Similarly, on the front surface of the second insulating substrate 21*b*, a second semiconductor element 22*b* and a second conductive plate 23*b* electrically connected to the second semiconductor element 22*b* are provided.

Each of the first semiconductor element 22*a* and the second semiconductor element 22*b* depicted in FIG. 2 includes a switching element, such as a power metal oxide semiconductor field effect transistor (power MOSFET) and an insulated gate bipolar transistor (IGBT). The first semiconductor element 22*a* functions as a switching element of the upper arm while the second semiconductor element 22*b* functions as a switching element of the lower arm. When such switching elements are power MOSFETs, each has, on its rear surface, a drain electrode (an input electrode) as a main electrode, and also has, on its front surface, a gate electrode (a control electrode) as a main electrode and a source electrode (an output electrode). When the switching elements are IGBTs, each has, on its rear surface, a collector electrode (an input electrode) as a main electrode, and also has, on the front surface, a gate electrode (a control electrode) as a main electrode and an emitter electrode (an output electrode).

Note that the first semiconductor element 22*a* and the second semiconductor element 22*b* may be reverse-conducting IGBTs (RC-IGBTs). Each RC-IGBT has integrated functions of both an IGBT and a free-wheeling diode (FWD), which is a diode element. Alternatively, the first semiconductor element 22*a* and the second semiconductor element 22*b* may be power MOSFETs made of silicon carbide. Further, the body diode of each power MOSFET (including those made of silicon carbide) may perform similar functions as an FWD of an RC-IGBT.

The first conductive plate 23*a* is included in a circuit pattern provided on the front surface of the first insulating substrate 21*a*. The second conductive plate 23*b* is included in a circuit pattern provided on the front surface of the second insulating substrate 21*b*. These circuit patterns are made of a metal with excellent electrical conductivity. The metal is, for example, copper or a copper alloy. Appropriate choices may be made for the number of circuit patterns and their shapes according to the specifications of the semiconductor module 10 and the like. As the first insulating substrate 21*a* and the second insulating substrate 21*b* with such circuit patterns formed thereon, for example, direct copper bonding (DCB) substrates or active metal brazed (AMB) substrates may be used.

The rear surface of the first semiconductor element 22*a* and the front surface of the first conductive plate 23*a* are joined by, for example, soldering, and thereby the first semiconductor element 22*a* and the first conductive plate 23*a* are electrically connected. Note that the output electrode of the first semiconductor element 22*a* is electrically connected to a third conductive plate 23*c* included in the circuit pattern provided on the front surface of the first insulating substrate 21*a*. The gate electrode of the first semiconductor element 22*a* is electrically connected to control terminals 35*a* provided in the case 30. Although not illustrated in the figures, wiring members such as bonding wires are used for electrical connection.

The output electrode of the second semiconductor element 22*b* is electrically connected to the second conductive plate 23*b* by, for example, a wiring member (not illustrated) such as a bonding wire. The gate electrode of the second semiconductor element 22*b* is also electrically connected to control terminals 35*b* provided in the case 30 by, for example, a wiring member (not illustrated) such as a bonding wire. Note that the rear surface of the second semiconductor element 22*b* is joined to the front surface of a fourth conductive plate 23*d* included in the circuit pattern on the front surface of the second insulating substrate 21*b* by, for example, soldering.

Other semiconductor elements may be provided on the first insulating substrate 21*a* and the second insulating substrate 21*b*. In the example of FIGS. 1 and 2, a semiconductor element 24*b* including a diode is disposed on the second insulating substrate 21*b*. The diode is, for example, a Schottky barrier diode (SBD) or a P-intrinsic-N (PiN) diode, and is connected in inverse parallel to the switching element as an FWD. The semiconductor element 24*b* has an output electrode (cathode electrode) as a main electrode on the rear surface, and an input electrode (anode electrode) as a main electrode on the front surface. The rear surface of the semiconductor element 24*b* is joined to the front surface of the fourth conductive plate 23*d* by soldering. The input electrode on the front surface of the semiconductor element 24*b* is electrically connected to the second conductive plate 23*b* by, for example, a wiring member (not illustrated) such as a bonding wire.

Although hidden below a second lead frame 32 (in the −Z direction) in FIGS. 1 and 2, a semiconductor element including a similar diode is also provided on the first insulating substrate 21*a*.

Although a detailed explanation is omitted, three pairs of the first insulating substrate 21*a* and the second insulating substrate 21*b* on which the individual semiconductor elements and conductive plates described above are provided are disposed in the X direction on the metal base 11. In addition, an insulting substrate with a brake circuit and the like formed thereon may be placed on the metal base 11.

The case 30 is obtained by integrally molding a first lead frame 31, the second lead frame 32, and a third lead frame 33 as well as various terminals, including the aforementioned control terminals 35*a* and 35*b*, together with a frame-like chassis 34.

The first lead frame 31, the second lead frame 32, and the third lead frame 33 are external connection terminals for a main current.

The first lead frame 31 includes a first wiring part (a first wiring part 31*a* of FIG. 3 to be described later) that is wired parallel to the front surfaces of the first insulating substrate 21*a* and the second insulating substrate 21*b*, and is joined to the first conductive plate 23*a*. Soldering, ultrasonic bonding, or the like is used to join the first lead frame 31 and the first conductive plate 23*a*. Both ends of the first lead frame 31 function as terminal parts 31*b* and 31*c*. The terminal parts 31*b* and 31*c* are exposed at the top of the chassis 34 and at the front surface of a lid (not illustrated) of the semiconductor module 10.

The second lead frame 32 includes a second wiring part (a second wiring part 32*a* of FIG. 3 to be described later) which runs along the wiring direction (the X direction) of the first wiring part in such a manner as to overlap the first wiring part with a gap from the front surface of the first wiring part. The second lead frame 32 is joined to the second conductive plate 23*b*. Soldering, ultrasonic bonding, or the like is used to join the second lead frame 32 and the second conductive plate 23*b*. Both ends of the second lead frame 32 function as terminal parts 32*b* and 32*c*. The terminal parts 32*b* and 32*c* are exposed at the top of the chassis 34 and at the front surface of the aforementioned lid (not illustrated) of the semiconductor module 10.

The third lead frame 33 is joined to the third conductive plate 23*c* and the fourth conductive plate 23*d*. Soldering, ultrasonic bonding, or the like is used to join the third lead frame 33 to the third conductive plate 23*c* and the fourth conductive plate 23*d*. One end of the third lead frame 33 functions as a terminal part 33*a*. The terminal part 33*a* is exposed at the top of the chassis 34, and serves as one of output terminals (a U-terminal, V-terminal, and W-terminal) of the semiconductor module 10.

The first lead frame 31, the second lead frame 32, and the third lead frame 33 are made of a material with excellent electrical conductivity. The material is, for example, aluminum, iron, silver, copper, or an alloy containing at least one of these.

The first insulating member 40 has, for example, the following configuration.

Figure 3:
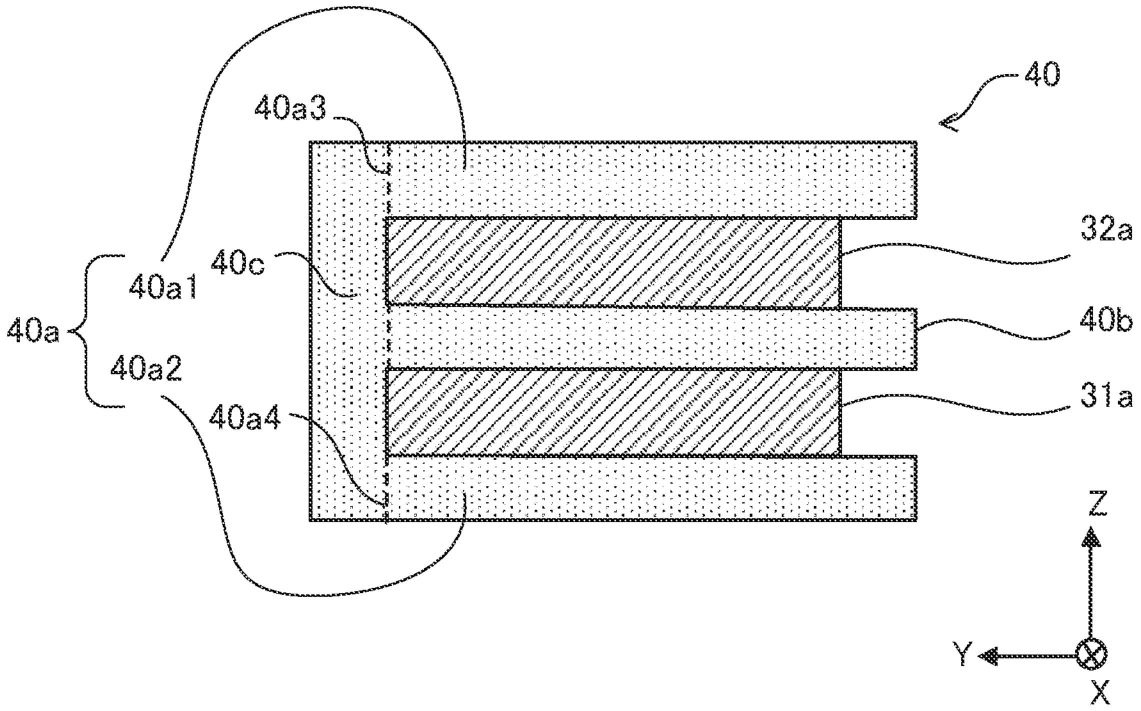
FIG. 3 is a cross-sectional view illustrating an attachment example of a first insulating member.

FIG. 3 is a cross-sectional view illustrating an attachment example of the first insulating member. FIG. 3 depicts the first insulating member 40, the first wiring part 31*a* of the first lead frame 31, and the second wiring part 32*a* of the second lead frame 32 in a cross section taken along dashed-dotted line III-III of FIG. 2.

The first insulating member 40 includes a clamping part 40*a* which is installed in an attachment area provided in part of where the first wiring part 31*a* and the second wiring part 32*a* overlap each other. The clamping part 40*a* sandwiches the first wiring part 31*a* and the second wiring part 32*a* by holding the rear surface of the first wiring part 31*a* and the front surface of the second wiring part 32*a*. The first insulating member 40 also includes a wiring gap part 40*b* that fills a gap between the first wiring part 31*a* and the second wiring part 32*a* in the aforementioned attachment area.

The clamping part 40*a* includes a first portion 40*a*1 in contact with the front surface of the second wiring part 32*a*, and a second portion 40*a*2 in contact with the rear surface of the first wiring part 31*a*. Further, in the example of the first insulating member 40 depicted in FIG. 3, the clamping part 40*a* includes a third portion 40*c* that connects lateral sides 40*a*3 and 40*a*4 of the first portion 40*a*1 and the second portion 40*a*2, respectively. The lateral sides 40*a*3 and 40*a*4 run parallel to the foregoing wiring direction and both lie in the same plane.

In the above, the first insulating member 40 is described separately into the clamping part 40*a* and the wiring gap part 40*b* in order to explain the shape of the first insulating member 40; however, the clamping part 40*a* and the wiring gap part 40*b* may be manufactured in one piece. Regarding the size of the first insulating member 40, there are no particular restrictions; however, it is preferable to have a size that does not interfere with structures below, such as bonding wires. The first insulating member 40 may be produced by, for example, a three-dimensional printer, molding, resin cutting, or the like.

The above-described first insulating member 40 is attached in a process performed before a joining process in which the first lead frame 31 and the second lead frame 32 are joined to the first conductive plate 23*a* and the second conductive plate 23*b*, respectively, as described later.

The second insulating member 50 has the following configuration, for example.

Figure 4:
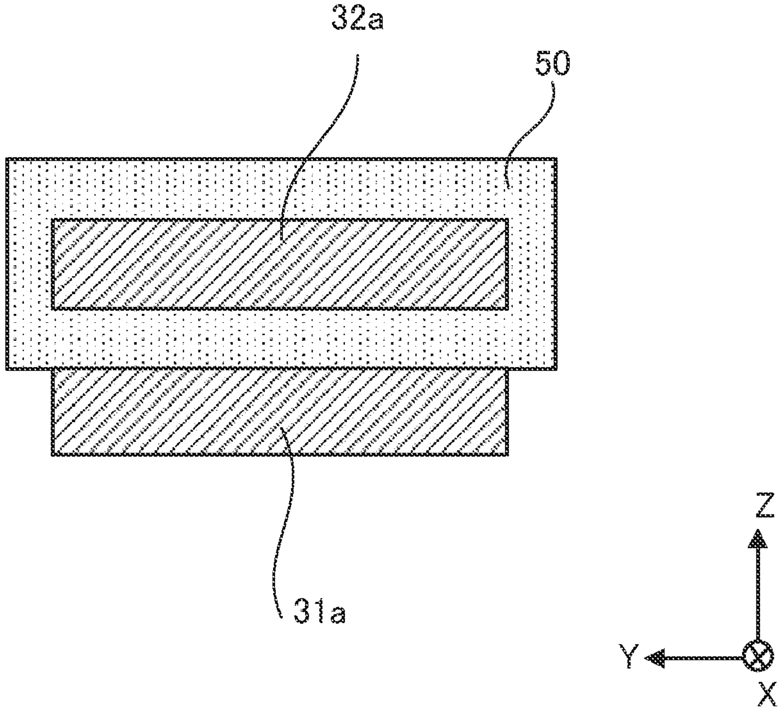
FIG. 4 is a cross-sectional view of a second insulating member.

FIG. 4 is a cross-sectional view of a second insulating member. FIG. 4 depicts the second insulating member 50, the first wiring part 31*a* of the first lead frame 31, and the second wiring part 32*a* of the second lead frame 32 in a cross section taken along dashed-dotted line IV-IV of FIG. 2.

The second insulating member 50 is formed to cover the front and rear surfaces of the second wiring part 32*a* as well as two lateral faces thereof opposing perpendicularly to the wiring direction (i.e., in the +Y direction). In addition, the second insulating member 50 may be formed to further cover the rear surface of the first wiring part 31*a* as well as two lateral faces thereof opposing perpendicularly to the wiring direction (i.e., in the #Y direction). The foregoing second insulating member 50 is formed before a process of manufacturing the case 30 by integral molding, as described later.

The first insulating member 40 and the second insulating member 50 are made of, for example, a thermoplastic resin. As such a thermoplastic resin, any of the following may be used: poly phenylene sulfide (PPS); polypropylene terephthalate (PPT); polybutylene terephthalate (PBT); polybutylene succinate (PBS); polyamide (PA); and acrylonitrile butadiene styrene (ABS).

Note that the first insulating member 40 and the second insulating member 50 each may be provided in plurality. The first insulating member 40 is removable during the process of manufacturing the semiconductor module 10. The effects of installing the first insulating member 40 and the second insulating member 50 are described later.

Although not illustrated, the semiconductor module 10 further includes a printed circuit board that is electrically connected to various terminals, such as the control terminals 35*a* and 35*b* of the case 30; a sealing member filled in a housing area surrounded by the chassis 34; and a lid for sealing the case 30.

(Method for Manufacturing Semiconductor Module 10)

Figure 5:
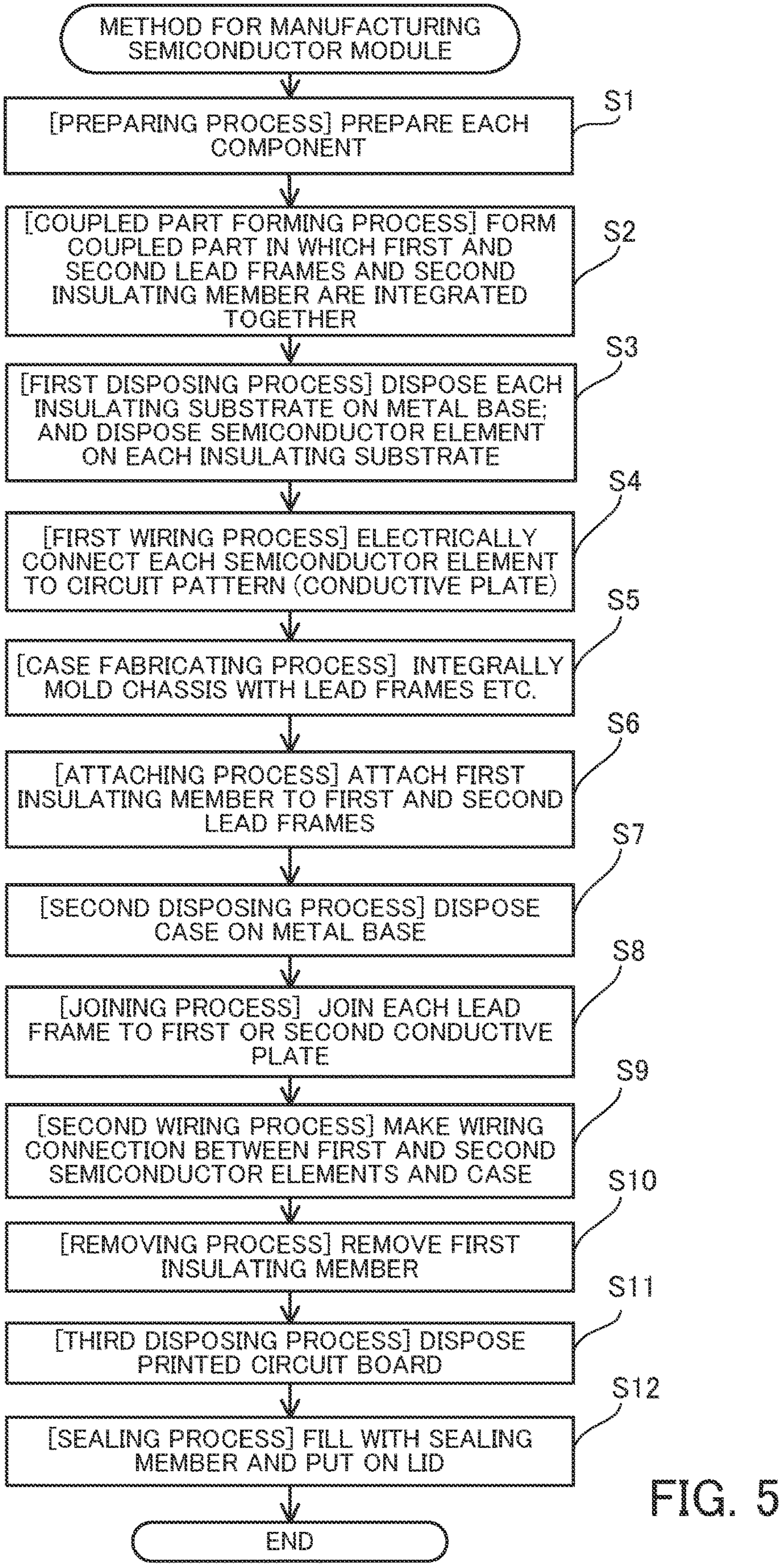
FIG. 5 is a flowchart illustrating an example of a method for manufacturing the semiconductor module according to the first embodiment.

FIG. 5 is a flowchart illustrating an example of a method for manufacturing the semiconductor module according to the first embodiment.

(Step S1) A preparing process is performed for preparing each component of the semiconductor module 10. Parts and other materials are prepared for making the metal base 11; the first insulating substrate 21*a* and the second insulating substrate 21*b* with circuit patterns including, for example, the first conductive plate 23*a* and the second conductive plate 23*b*, respectively; the first semiconductor element 22*a*; the second semiconductor element 22*b*; and the case 30. Parts for manufacturing the case 30 include, for example, the first lead frame 31, the second lead frame 32, the third lead frame 33, the chassis 34, the control terminals 35*a* and 35*b*, and the first insulating member 40. The first insulating member 40 is produced in advance by, for example, a three-dimensional printer, metal molding, or resin cutting.

(Step S2) A coupled part forming process is performed to form a coupled part in which the first lead frame 31, the second lead frame 32, and the second insulating member 50 are integrated into one piece. Such a coupled part may be formed by integral molding using a mold. The second insulating member 50 is formed such as to cover the front and rear surfaces of the second wiring part 32*a* of the second lead frame 32 as well as the two lateral faces thereof opposing perpendicularly to the wiring direction, as illustrated in FIG. 4. The lower surface of the second insulating member 50 covers the front surface of the first wiring part 31*a* of the first lead frame 31. Note that the second insulating member 50 may be configured to further cover the rear surface of the first wiring part 31*a* as well as the two lateral faces thereof opposing perpendicularly to the wiring direction.

(Step S3) A first disposing process is performed. In the first disposing process, the first insulating substrate 21*a* and the second insulating substrate 21*b* are placed on the metal base 11. The first insulating substrate 21*a* and the second insulating substrate 21*b* are fixed to the metal base 11 by, for example, soldering. Further in the first disposing process, individual semiconductor elements are placed on the circuit patterns on the front surfaces of the first insulating substrate 21*a* and the second insulating substrate 21*b*. For example, the first semiconductor element 22*a* is placed on the first conductive plate 23*a* included in the circuit pattern of the first insulating substrate 21*a*, and the second semiconductor element 22*b* is placed on the fourth conductive plate 23*d* included in the circuit pattern of the second insulating substrate 21*b*, as illustrated in FIG. 2.

(Step S4) A first wiring process is performed. In the first wiring process, each semiconductor element is electrically connected to a predetermined circuit pattern (conductive plate). In the example of FIG. 2, the first semiconductor element 22*a* is electrically connected to the first conductive plate 23*a* by, for example, soldering the input electrode on the rear surface of the first semiconductor element 22*a* and the front surface of the first conductive plate 23*a*. The second semiconductor element 22*b* is electrically connected to the second conductive plate 23*b* by connecting the output electrode on the front surface of the second semiconductor element 22*b* to the second conductive plate 23*b* with, for example, a wiring member such as a bonding wire.

Note that the output electrode of the first semiconductor element 22*a* is electrically connected to the third conductive plate 23*c* by, for example, a wiring member such as a bonding wire. The input electrode on the rear surface of the second semiconductor element 22*b* is joined to the front surface of the fourth conductive plate 23*d* by, for example, soldering.

(Step S5) A case fabricating process is performed. The case 30 is fabricated by integrally molding the first lead frame 31, the second lead frame 32, the third lead frame 33, and the foregoing various terminals, such as the control terminals 35*a* and 35*b*, together with the frame-like chassis 34. In the case fabricating process, the first lead frame 31, the second lead frame 32, and the second insulating member 50 are set in a mold as an integrally coupled part. This prevents the proper positional relationship between the chassis 34, the first lead frame 31, and the second lead frame 32 from being impaired due to heat history during the integral molding in the case fabricating process. However, the second insulating member 50 does not need to be provided if such positional displacement need not be taken into account. In that case, the process of step S2 may be omitted.

(Step S6) An attaching process is performed. In the attaching process, the first insulating member 40 is installed in an attachment area provided in part of the first wiring part 31*a* of the first lead frame 31 and the second wiring part 32*a* of the second lead frame 32, as explained with reference to FIG. 3. The attachment area where the first insulating member 40 is installed is, for example, an area not interfering with structures below, such as bonding wires. Note that in the examples of FIGS. 1 and 2, a single first insulating member 40 is installed; however, multiple first insulating members 40 may be installed instead. Appropriate choices may be made to the number of first insulating members 40 and their attachment positions according to the situation of the structures located below.

The first insulating member 40 as illustrated in FIG. 3 is movable in the wiring direction (the X direction) of the first lead frame 31 and the second lead frame 32. Therefore, even after being once installed, the first insulating member 40 may be adjusted to a position in the X direction. In the example of FIG. 3, the first insulating member 40 is E-shaped when viewed in the +X direction, and is removable from the first wiring part 31*a* and the second wiring part 32*a* in the +Y direction. Therefore, even after being once installed, the first insulating member 40 may be removed and reinstalled at a more appropriate position. This also offers improved flexibility in the installation of wiring members, such as bonding wires. Note that the attaching process may be performed manually or by an automatic machine.

(Step S7) A second disposing process is performed. In the second disposing process, the case 30 produced in the process of step S5 is placed on the metal base 11. The case 30 is placed on the top face of the outer periphery of the metal base 11 and then fixed thereto using an adhesive, for example.

(Step S8) A joining process is performed. In the joining process, the first lead frame 31 is joined to the first conductive plate 23*a* while the second lead frame 32 is joined to the second conductive plate 23*b*.

(Step S9) A second wiring process is performed. Wiring connection is made between the first and second semiconductor elements 22*a* and 22*b* and the case 30. For example, the gate electrode of the first semiconductor element 22*a* is electrically connected to the control terminals 35*a* of the case 30 by wiring members, such as bonding wires. Similarly, the gate electrode of the second semiconductor element 22*b* is electrically connected to the control terminals 35*b* of the case 30.

(Step S10) A removing process is performed. In this process, the first insulating member 40 is removed from the aforementioned attachment area. In the removing process, the first insulating member 40 is pulled out in the +Y direction in the example of FIG. 3. Note that the first insulating member 40 need not be removed unless it has a negative impact on other structures (such as bonding wires and a printed circuit board to be disposed later).

(Step S11) A third disposing process is performed. A printed circuit board for controlling switching elements is disposed above the second lead frame 32 in the case 30 and then electrically connected to various terminals of the case 30, such as the control terminals 35*a* and 35*b*.

(Step S12) A sealing process is performed. A sealing member (an insulating resin material) is filled into the housing area surrounded by the chassis 34 and then hardened. By gluing a lid to the top face of the chassis 34, the housing area is sealed. Herewith, the semiconductor module 10 is completed.

The order of the above-described processes is just an example. For example, the process of step S2 may take place after the process of step S3 or step S4, and the process of step S6 may take place after the process of step S7. Further, the process of step S10 may come between the processes of step S8 and step S9, or between the processes of step S11 and step S12.

As described above, in the method for manufacturing the semiconductor module 10 of the first embodiment, the attaching process of the first insulating member 40 precedes the process of joining the first lead frame 31 and the second lead frame 32 to the first conductive plate 23*a* and the second conductive plate 23*b*, respectively.

In the joining process, the first insulating member 40 is being attached to the first lead frame 31 and the second lead frame 32, which prevents the first lead frame 31 from warping into a convex shape due to heat generated during joining and then coming into contact with the second lead frame 32. Furthermore, the first insulating member 40 prevents the second lead frame 32 from warping into a concave shape and then coming into contact with the first lead frame 31. Similar effects may be achieved by the second insulating member 50 of FIG. 4.

The second insulating member 50 seals a part of the second wiring part 32*a* of the second lead frame 32, as illustrated in FIG. 4. Herewith, the second insulating member 50 is not removed from the second lead frame 32 and maintains the distance in the +Z direction between the second wiring part 32*a* of the second lead frame 32 and the first wiring part 31*a* of the first lead frame 31, thus allowing insulation to be secured. However, the second insulating member 50 alone fails to sufficiently prevent the first lead frame 31 from warping into a concave shape. If such a deformation occurs, the first lead frame 31 strongly abuts against structures (such as bonding wires) on the first insulating substrate 21*a* and the second insulating substrate 21*b*, which may result in problems with the installation of the case 30 onto the metal base 11, the installation of terminals, and the like. This may lead to reduced reliability of the semiconductor module 10.

On the other hand, attachment of the first insulating member 40 to the first lead frame 31 and the second lead frame 32, as depicted in FIG. 3, prevents the first lead frame 31 from warping into a concave shape. This avoids the above problems from occurring, thereby reducing the loss of reliability of the semiconductor module 10.

Note that, in the case of removing the first insulating member 40 in the process of step S10, the removed first insulating member 40 may also be used when manufacturing another semiconductor module. That is, the first insulating member 40 is reusable, and there is, therefore, no need to make a new first insulating member 40 each time a semiconductor module is manufactured.

In the above example, the semiconductor module 10 includes multiple insulating substrates, including the first insulating substrate 21*a* and the second insulating substrate 21*b*; however, the semiconductor module 10 may have only one insulating substrate.

Also, in the above example, the first lead frame 31 and the second lead frame 32 are joined to the first conductive plate 23*a* and the second conductive plate 23*b*, respectively; however, the applicable scope of the technology according to the first embodiment is not limited to this example. The first lead frame 31 is joined to the first circuit pattern on the metal base 11 while the second lead frame 32 is joined to the second circuit pattern on the metal base 11. Different potentials are applied to the first lead frame 31 and the second lead frame 32 and, therefore, different potentials are applied to the first circuit pattern and the second circuit pattern. The first conductive plate 23*a* is an example of the first circuit pattern, and the second conductive plate 23*b* is an example of the second circuit pattern.

Furthermore, the first circuit pattern may be the main electrode on the front surface of the first semiconductor element 22*a*, and the second circuit pattern may be the main electrode on the front surface of the second semiconductor element 22*b*. In that case, each of these main electrodes is joined to the first lead frame 31 or the second lead frame 32 using, for example, a silver sintered material.

Note that the first circuit pattern (including the first conductive plate 23*a*) or the main electrode on the front surface of the first semiconductor element 22*a* is a specific example of a first conductive part. In addition, the second circuit pattern (including the second conductive plate 23*b*) or the main electrode on the front surface of the second semiconductor element 22*b* is a specific example of a second conductive part.

(Modifications of First Insulating Member)

Figure 6:
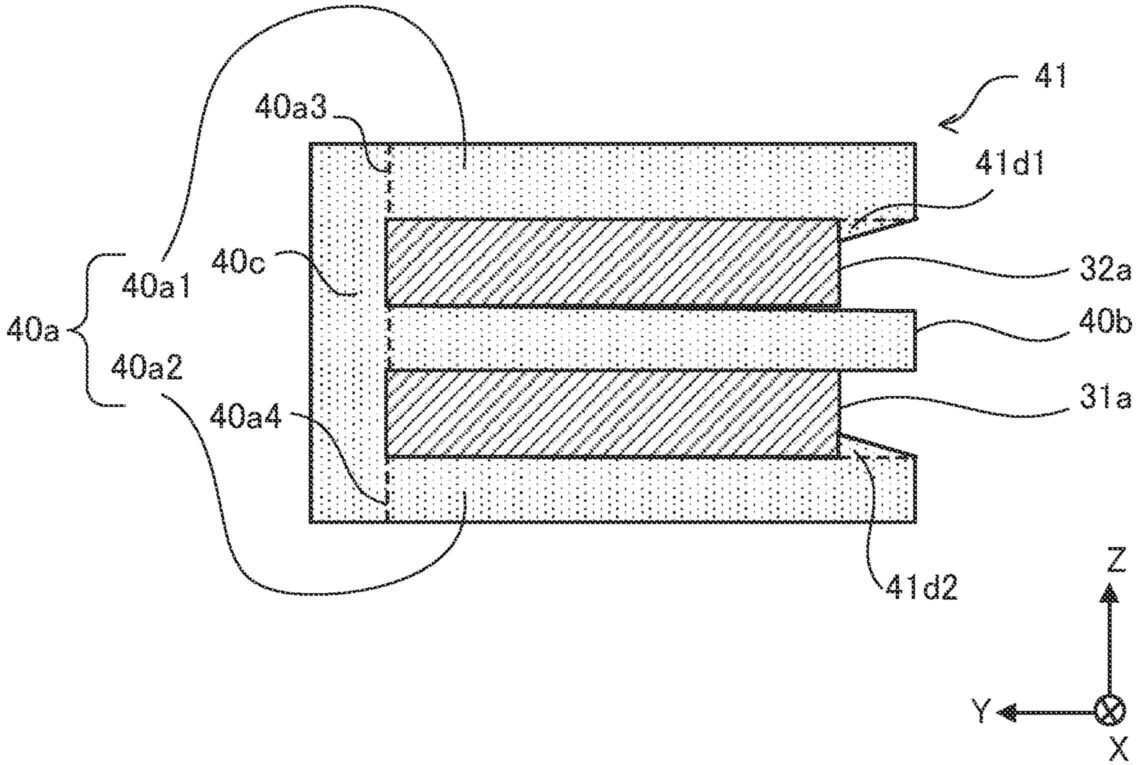
FIG. 6 is a cross-sectional view illustrating a first modification of the first insulating member.

FIG. 6 is a cross-sectional view illustrating a first modification of the first insulating member. In FIG. 6, like reference numerals refer to identical components depicted in FIG. 3.

The clamping part 40*a* of a first insulating member 41 of the modification has barbs 41*d*1 and 41*d*2 at the tips of the lateral edges of the surfaces thereof which are respectively in contact with the front surface of the second wiring part 32*a* and the rear surface of the first wiring part 31*a*. The lateral edges run parallel to the wiring direction. The barbs 41*d*1 and 41*d*2 face the second wiring part 32*a* and the first wiring part 31*a*, respectively, from the tips. The foregoing first insulating member 41 may be installed in the attaching process of step S6 of FIG. 5, in the same manner as the first insulating member 40 depicted in FIG. 3.

Provision of the barbs 41*d*1 and 41*d*2 prevents the first insulating member 41 from coming off from the first lead frame 31 and the second lead frame 32 in the +Y direction. Note that when the first insulating member 41 of the first modification is used, the first insulating member 41 is not removed in the removing process of step S10 described above.

Figure 7:
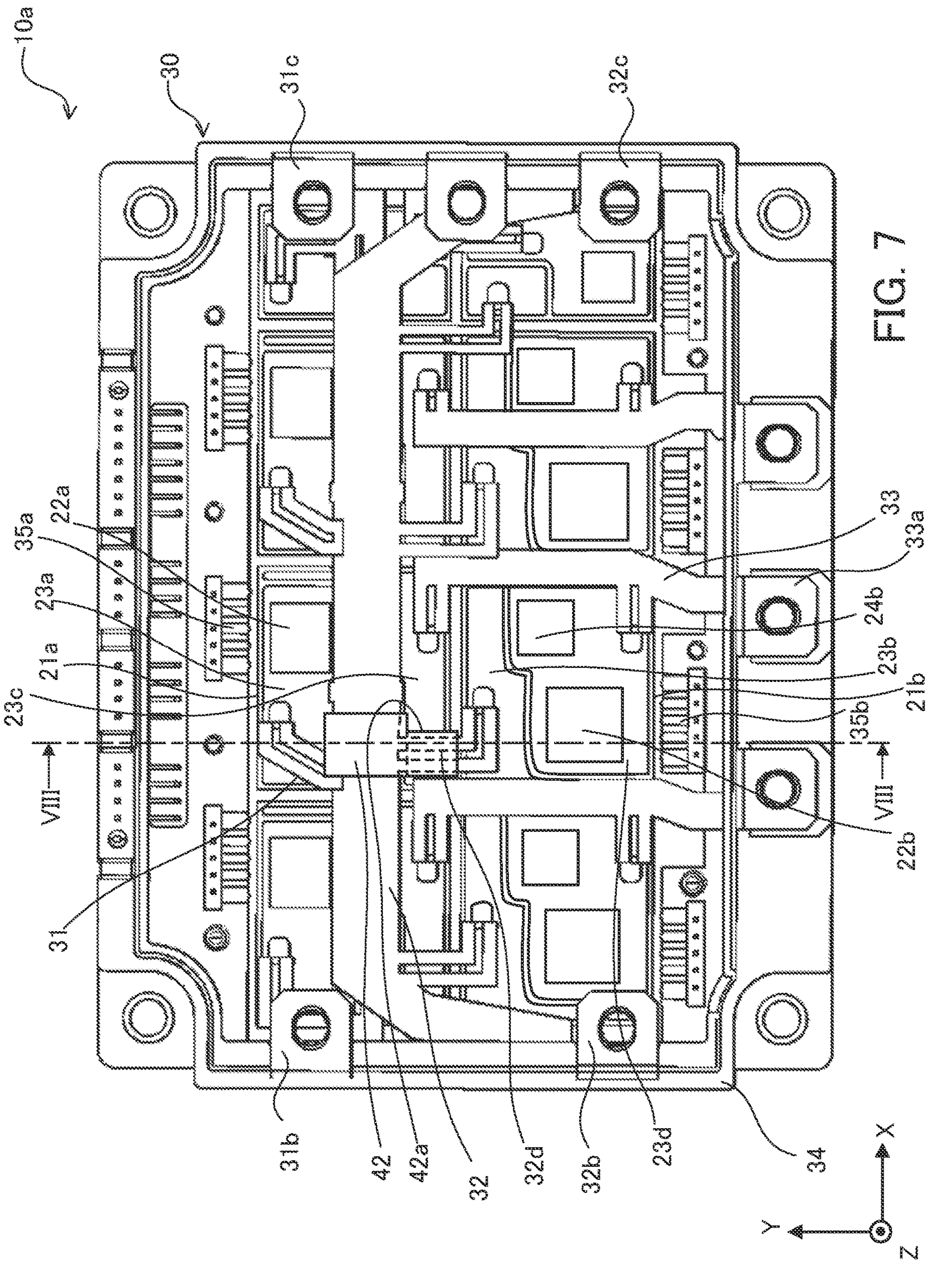
FIG. 7 is a plan view of a semiconductor module, illustrating a second modification of the first insulating member.
Figure 8:
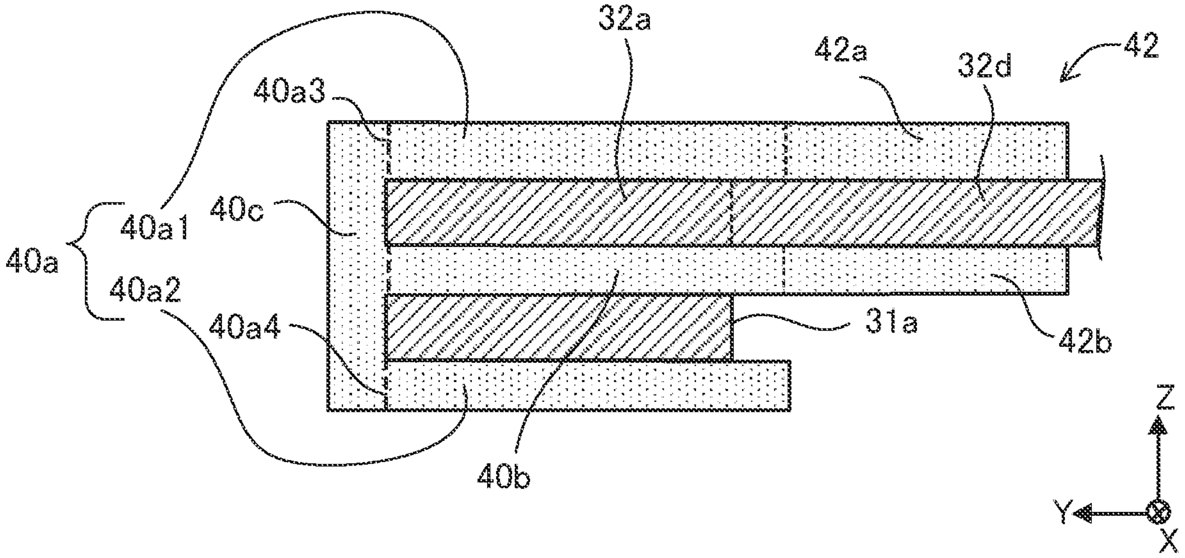
FIG. 8 is a cross-sectional view illustrating the second modification of the first insulating member.

FIG. 7 is a plan view of a semiconductor module, illustrating a second modification of the first insulating member. FIG. 8 is a cross-sectional view illustrating the second modification of the first insulating member. FIG. 8 depicts a first insulating member 42, the first wiring part 31*a* of the first lead frame 31, the second wiring part 32*a* of the second lead frame 32, and a third wiring part 32*d* in a cross section taken along dashed-dotted line VIII-VIII of FIG. 7. In FIGS. 7 and 8, like reference numerals refer to identical components depicted in FIGS. 2 and 3. Note that FIG. 7 omits illustration of the second insulating member 50 depicted in FIG. 2.

In a semiconductor module 10*a* of FIG. 7, the second lead frame 32 has the third wiring part 32*d*, which projects parallel to the front surface of the second wiring part 32*a* from the second wiring part 32*a*.

In the first insulating member 42, the first portion 40*a*1 of the clamping part 40*a* and the wiring gap part 40*b* include extension portions 42*a* and 42*b*, respectively, to sandwich the third wiring part 32*d* therebetween. The use of the first insulating member 42 prevents the third wiring part 32*d*, which projects parallel to the front surface of the second wiring part 32*a* from the second wiring part 32*a*, from becoming deformed in the joining process of step S8 of FIG. 5 described above.

Note that the first insulating member 42 may be removed in the removing process of step S10 described above. In the removing process, the first insulating member 42 is pulled out in the +Y direction in the example of FIG. 8.

Although no illustration is given here, also when the first lead frame 31 has a third wiring part which projects parallel to the front surface of the first wiring part 31*a* from the first wiring part 31*a*, similar effects may be achieved by providing a similar extension portion to the first insulating member 42. In that case, the second portion 40*a*2 of the clamping part 40*a* and the wiring gap part 40*b* are configured to include extension portions to sandwich the third wiring part therebetween.

Figure 9:
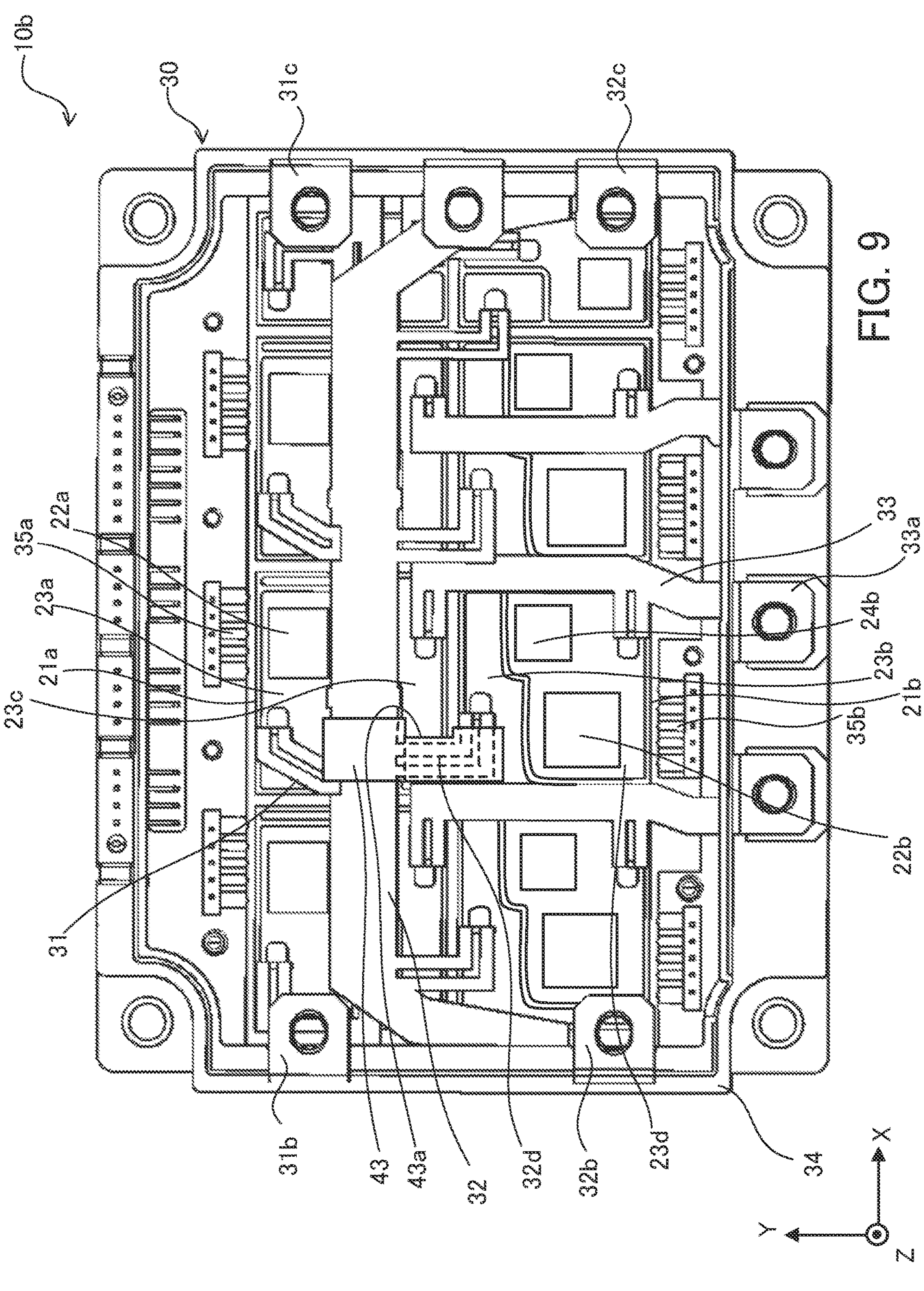
FIG. 9 is a plan view of a semiconductor module, illustrating a third modification of the first insulating member.

FIG. 9 is a plan view of a semiconductor module, illustrating a third modification of the first insulating member. In FIG. 9, like reference numerals refer to identical components depicted in FIGS. 2 and 7. Note that FIG. 9 omits illustration of the second insulating member 50 depicted in FIG. 2.

In a semiconductor module 10*b* of FIG. 9, an extension portion 43*a* of a first insulating member 43 corresponds to the extension portion 42*a* of the first insulating member 42 of FIG. 7. Note however that the extension portion 43*a* is longer than the extension portion 42*a* along the third wiring part 32*d*. Although no illustration is given here, the extension portion of the wiring gap part of the first insulating member 43 is also formed longer than the extension portion 42*b* of FIG. 8 along the third wiring part 32*d*, similarly to the extension portion 42*a*.

Thus, appropriate choices may be made to the shapes of the first insulating members 42 and 43 according to the shape and the like of the third wiring part 32*d*.

Note that the above-described first insulating members 40 to 43 may be used in combination with each other.

(b) Second Embodiment

Next described are a semiconductor module and a manufacturing method therefor according to a second embodiment, with reference to FIGS. 10 to 13.

Figure 10:
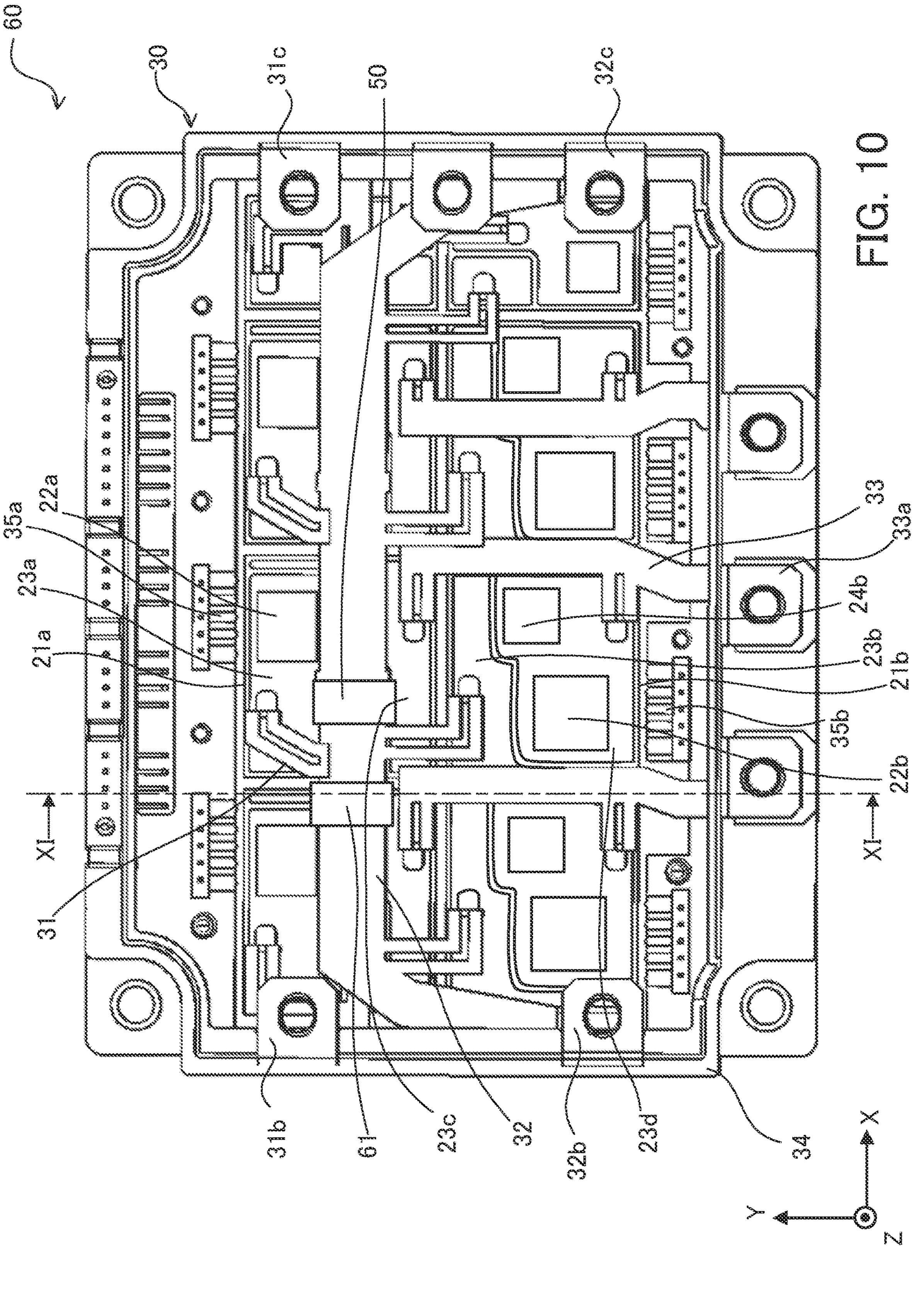
FIG. 10 is a plan view of a semiconductor module according to a second embodiment.

FIG. 10 is a plan view of a semiconductor module according to the second embodiment. In FIG. 10, like reference numerals refer to identical components depicted in FIG. 2.

In a semiconductor module 60 of the second embodiment, a first insulating member 61 has the following configuration, for example.

Figure 11:
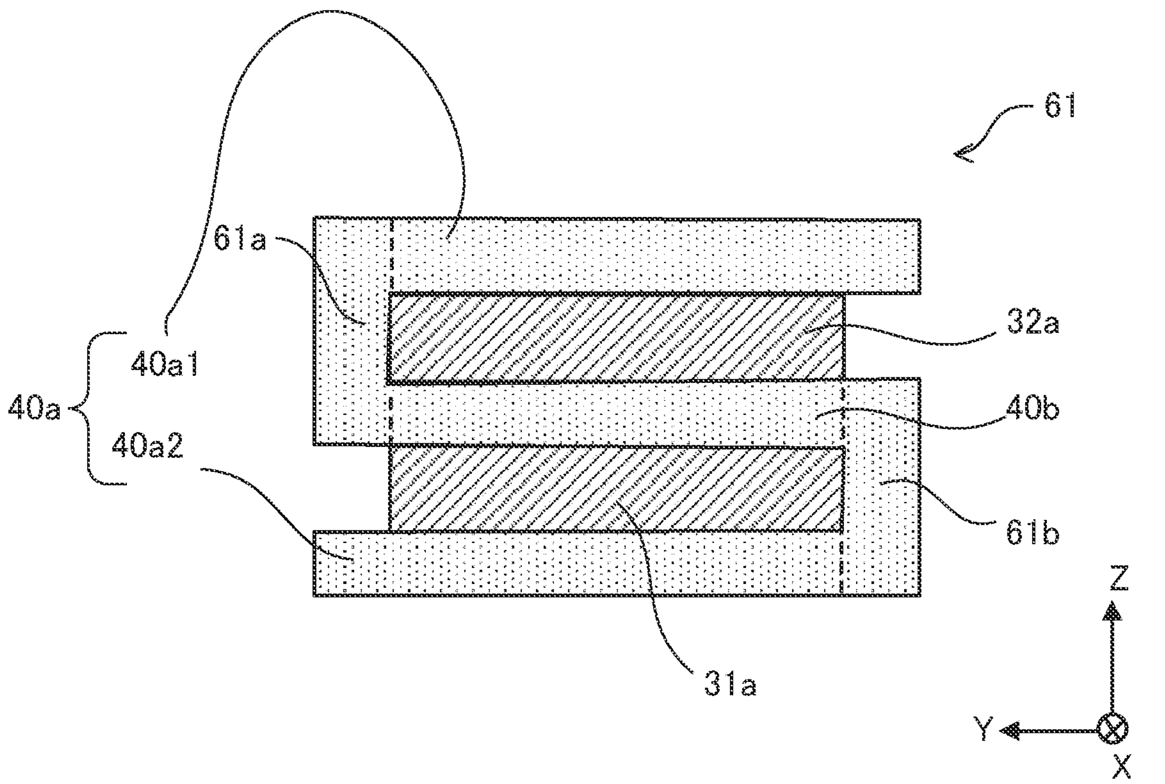
FIG. 11 is a cross-sectional view illustrating an example of a first insulating member of the second embodiment.

FIG. 11 is a cross-sectional view illustrating an example of the first insulating member of the second embodiment. FIG. 11 depicts the first insulating member 61, the first wiring part 31*a* of the first lead frame 31, and the second wiring part 32*a* of the second lead frame 32 in a cross-section taken along dashed-dotted line XI-XI of FIG. 10.

The first insulating member 61 includes the clamping part 40*a* sandwiching a part of an overlap region, in which the first wiring part 31*a* and the second wiring part 32*a* overlap each other, from the rear surface of the first wiring part 31*a* and the front surface of the second wiring part 32*a*. The first insulating member 61 also includes the wiring gap part 40*b* that fills the gap between the first wiring part 31*a* and the second wiring part 32*a* in the part of the overlap region.

The clamping part 40*a* includes the first portion 40*a*1 in contact with the front surface of the second wiring part 32*a* and the second portion 40*a*2 in contact with the rear surface of the first wiring part 31*a*. The first insulating member 61 also includes a third portion 61*a* connecting the first portion 40*a*1 and a first end of the wiring gap part 40*b* and a fourth portion 61*b* connecting the second portion 40*a*2 and a second end of the wiring gap part 40*b*, opposing the first end thereof.

In the above, the first insulating member 61 is described separately into multiple parts in order to explain the shape of the first insulating member 61; however, the multiple parts may be manufactured in one piece. Regarding the size of the first insulating member 61, there are no particular restrictions; however, it is preferable to have a size that does not interfere with structures below, such as bonding wires.

The above-described first insulating member 61 is formed before a process of manufacturing the case 30 by integral molding, as described later.

The first insulating member 61 is made of, for example, a thermoplastic resin. Examples of the thermoplastic resin include PPS, PPT, PBT, PBS, PA, and ABS.

Note that the first insulating member 61 may be provided in plurality.

(Method for Manufacturing Semiconductor Module 60)

Figure 12:
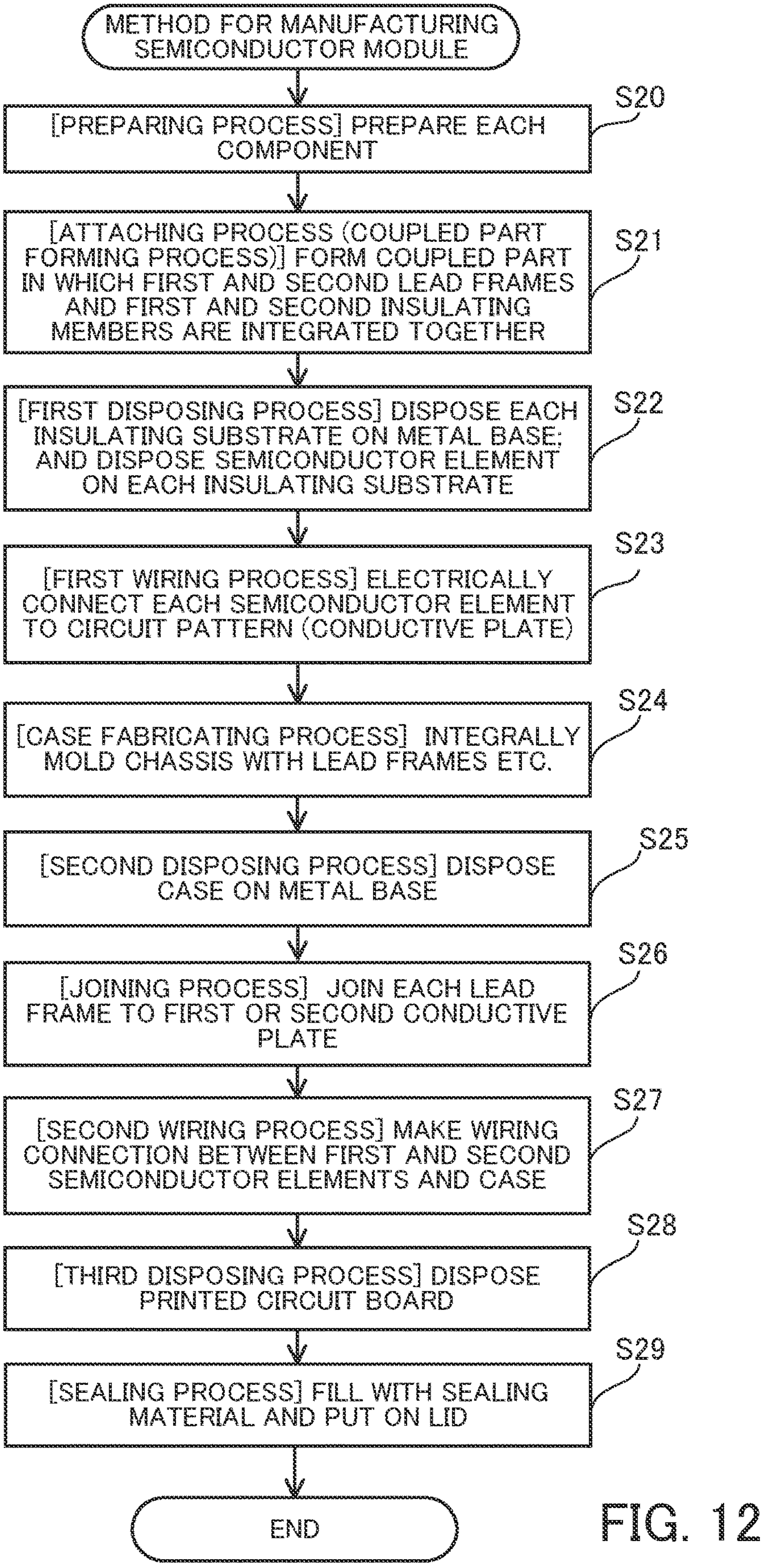
FIG. 12 is a flowchart illustrating an example of a method for manufacturing the semiconductor module according to the second embodiment.

FIG. 12 is a flowchart illustrating an example of a method for manufacturing the semiconductor module according to the second embodiment.

(Step S20) A preparing process is performed for preparing each component of the semiconductor module 60. Parts and other materials are prepared for making the metal base 11; the first insulating substrate 21*a* and the second insulating substrate 21*b* with circuit patterns including, for example, the first conductive plate 23*a* and the second conductive plate 23*b*, respectively; the first semiconductor element 22*a*; the second semiconductor element 22*b*; and the case 30. Parts for manufacturing the case 30 include, for example, the first lead frame 31, the second lead frame 32, the third lead frame 33, the chassis 34, and the control terminals 35*a* and 35*b*.

(Step S21) A coupled part forming process is performed to form a coupled part in which the first lead frame 31, the second lead frame 32, the first insulating member 61, and the second insulating member 50 are integrated into one piece. Such a coupled part may be formed by integral molding using a mold. According to the method for manufacturing the semiconductor module 60 of the second embodiment, the first insulating member 61 is attached to the first lead frame 31 and the second lead frame 32 in this process, unlike the method for manufacturing the semiconductor module 10 of the first embodiment. Therefore, the process of step S21 may also be called attaching process.

The processes of steps S22 and S23 are the same as those of steps S3 and S4 of FIG. 5.

(Step S24) A case fabricating process is performed. In the process of step S24, the case 30 is fabricated by integrally molding the first lead frame 31, the second lead frame 32, the third lead frame 33, and the foregoing various terminals, such as the control terminals 35*a* and 35*b*, together with the frame-like chassis 34. In the case fabricating process, the first lead frame 31, the second lead frame 32, the first insulating member 61, and the second insulating member 50 are set in a mold as an integrally coupled part. This prevents the proper positional relationship between the chassis 34, the first lead frame 31, and the second lead frame 32 from being impaired due to heat history during the integral molding in the case fabricating process. Note that such an effect is achieved not only by the second insulating member 50 but also by the first insulating member 61 depicted in FIG. 11, and the second insulating member 50, therefore, does not need to be provided. Nevertheless, the use of the second insulating member 50 enhances the effect. Furthermore, the use of the second insulating member 50 allows the insulation distance to be increased.

The processes of steps S25 to S27 are the same as those of steps S7 to S9 of FIG. 5.

In the method for manufacturing the semiconductor module 60 according to the second embodiment, the first insulating member 61 is attached to the first lead frame 31 and the second lead frame 32, not after, but before the case fabricating process, as described above. Note however that the first insulating member 61 depicted in FIG. 11 is movable in the wiring direction (the X direction) of the first lead frame 31 and the second lead frame 32. Therefore, the position of the first insulating member 61 is adjustable in the X direction. This also offers improved flexibility in the installation of wiring members, such as bonding wires.

In the method for manufacturing the semiconductor module 60 according to the second embodiment, the first insulating member 61 having an S-shape when viewed in the +X direction in the example of FIG. 11 fails to be removed from the first wiring part 31*a* and the second wiring part 32*a*. Therefore, the removing process of step S10 depicted in FIG. 5 does not take place.

The processes of steps S28 and S29 are the same as those of steps S11 and S12 of FIG. 5.

The order of the steps above is just an example. For example, the process of step S21 may come after that of step S22 or S23.

In the method for manufacturing the semiconductor module 60 according to the second embodiment, the attaching process for the first insulating member 61 is performed before the joining process in which the first lead frame 31 and the second lead frame 32 are joined to the first conductive plate 23*a* and the second conductive plate 23*b*, respectively, as described above.

In the joining process, the first insulating member 61 is being attached to the first lead frame 31 and the second lead frame 32, which prevents the first lead frame 31 from warping into a convex shape due to heat generated during joining and then coming into contact with the second lead frame 32. The first insulating member 61 also prevents the second lead frame 32 from warping into a concave shape and then coming into contact with the first lead frame 31. Furthermore, the first insulating member 61 being attached to the first lead frame 31 and the second lead frame 32 prevents the first lead frame 31 from warping into a concave shape. Herewith, it is possible to prevent the first lead frame 31 from strongly abutting against structures on the first insulating substrate 21*a* and the second insulating substrate 21*b*, which may result in problems with the installation of the case 30 onto the metal base 11, the installation of terminals, and the like. This may reduce the loss of reliability of the semiconductor module 60.

Also, in the semiconductor module 60 of the second embodiment, the first insulating members 40 to 43 depicted in FIGS. 3 and 6 to 9 may be attached to the first lead frame 31 and the second lead frame 32. In that case, the first insulating members 40 to 43 may be attached to the first lead frame 31 and the second lead frame 32 between the processes of steps S24 and S26.

When the first insulating members 40, 42, and 43 are used, these may be removed, for example, after the joining process of step S26.

The semiconductor module 60 of the second embodiment includes multiple insulating substrates, including the first insulating substrate 21*a* and the second insulating substrate 21*b*, similarly to the semiconductor module 10 of the first embodiment; however, the semiconductor module 60 may have only one insulting substrate.

Also, in the above example, the first lead frame 31 and the second lead frame 32 are joined to the first conductive plate 23*a* and the second conductive plate 23*b*, respectively; however, the applicable scope of the technology according to the second embodiment is not limited to this example. The first lead frame 31 is joined to the first circuit pattern on the metal base 11 while the second lead frame 32 is joined to the second circuit pattern on the metal base 11. Different potentials are applied to the first lead frame 31 and the second lead frame 32 and, therefore, different potentials are applied to the first circuit pattern and the second circuit pattern. The first conductive plate 23*a* is an example of the first circuit pattern, and the second conductive plate 23*b* is an example of the second circuit pattern.

Furthermore, the first circuit pattern may be the main electrode on the front surface of the first semiconductor element 22*a*, and the second circuit pattern may be the main electrode on the front surface of the second semiconductor element 22*b*. In that case, each of these main electrodes is joined to the first lead frame 31 or the second lead frame 32 using, for example, a silver sintered material.

(Modification of First Insulating Member)

Figure 13:
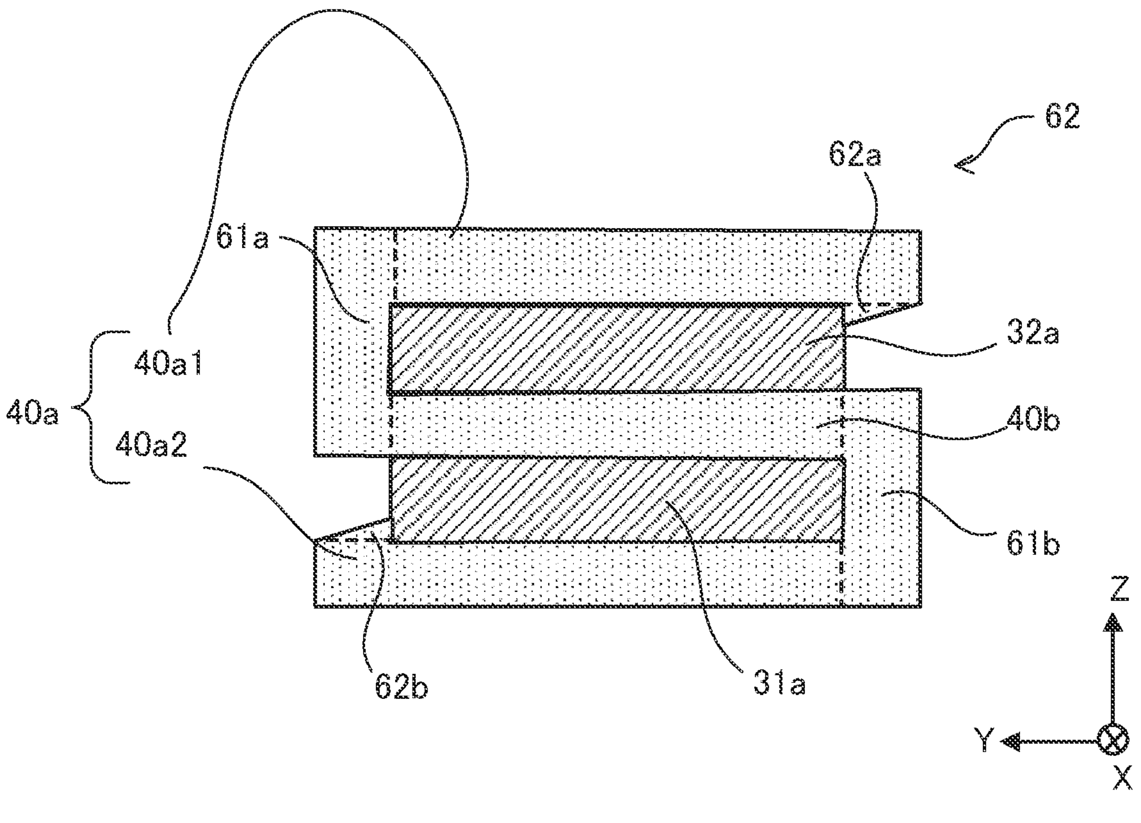
FIG. 13 is a cross-sectional view illustrating a modification of the first insulating member.

FIG. 13 is a cross-sectional view illustrating a modification of the first insulating member. In FIG. 13, like reference numerals refer to identical components depicted in FIG. 11.

The clamping part 40*a* of a first insulating member 62 of the modification has barbs 62*a* and 62*b* at the tips of the lateral edges of the surfaces thereof which are respectively in contact with the front surface of the second wiring part 32*a* and the rear surface of the first wiring part 31*a*. The lateral edges run parallel to the wiring direction. The barbs 62*a* and 62*b* face the second wiring part 32*a* and the first wiring part 31*a*, respectively, from the tips. The foregoing first insulating member 62 may be installed in the attaching process of step S21 of FIG. 12, in the same manner as the first insulating member 61 depicted in FIG. 11.

Provision of the barbs 62*a* and 62*b* prevents the first insulating member 62 from shifting from the appropriate attachment area.

Having described aspects of the semiconductor module and manufacturing method therefor based on the embodiments above, they are merely examples and the particular details of these illustrative examples shall not be construed as limitations on the appended claims.

According to an aspect, it is possible to reduce the loss of reliability of a semiconductor module due to deformation of lead frames thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method for manufacturing a semiconductor module, the method comprising:

disposing, on a metal base, one or more insulating substrates each having, on a front surface thereof, a first semiconductor element, a second semiconductor element, a first conductive plate, and a second conductive plate;

connecting electrically the first semiconductor element and the second semiconductor element to the first conductive plate and the second conductive plate, respectively;

disposing, on the metal base, a case including a first lead frame, a second lead frame, and a frame-like chassis that are integrally molded together, the first lead frame including a first wiring part that extends in parallel to the front surface of the one or more insulating substrates, and the second lead frame including a second wiring part that extends in a wiring direction of the first wiring part in such a manner as to overlap the first wiring part with a gap from a front surface of the first wiring part;

joining the first lead frame and the second lead frame to a first circuit pattern and a second circuit pattern, respectively, on the metal base; and attaching, before the joining of the first lead frame and the second lead frame to the first circuit pattern and the second circuit pattern, respectively, one or more insulating members, each including a clamping part and a wiring gap part, to an attachment area provided in part of where the first wiring part and the second wiring part overlap each other, the clamping part sandwiching the first and second wiring parts at the attachment area from a rear surface of the first wiring part and a front surface of the second wiring part, and the wiring gap part filling the gap between the first and second wiring parts in the attachment area.

2. The method according to claim 1, wherein in each of the one or more insulating members, the clamping part includes a first portion in contact with the front surface of the second wiring part, a second portion in contact with the rear surface of the first wiring part, and a third portion connecting a lateral part of the first portion to a lateral part of the second portion, the lateral parts of the first and second portions extending in parallel to the wiring direction and lying in a same plane, and a lateral part of the wiring gap part, which lies in the same plane as the lateral parts of the first and second portions, is connected to the third portion.

3. The method according to claim 2, further comprising integrally molding the case before the disposing of the case on the metal base, wherein the attaching of the one or more insulating members to the attachment area is performed after the integrally molding of the case.

4. The method according to claim 2, further comprising detaching the one or more insulating members from the attachment area, after the detaching of the one or more insulating members, filling with a sealing member a housing area surrounded by the chassis.

5. The method according to claim 2, wherein:

the first lead frame or the second lead frame includes a third wiring part that projects in parallel to the front surfaces of the first and second wiring parts from the first wiring part or the second wiring part, and the first portion or the second portion of the clamping part and the wiring gap part each include extension portions that sandwich the third wiring part therebetween.

6. The method according to claim 1, wherein the clamping part includes a first portion in contact with the front surface of the second wiring part, a second portion in contact with the rear surface of the first wiring part, a third portion connecting the first portion to a first end of the wiring gap part, and a fourth portion connecting the second portion to a second end of the wiring gap part that is opposite to the first end of the wiring gap part.

7. The method according to claim 6, further comprising integrally molding the case before the disposing of the case on the metal base, wherein the attaching of the one or more insulating members to the attachment area is performed before the integrally molding of the case.

8. The method according to claim 1, wherein the clamping part has barbs at tips of lateral edges of surfaces thereof that are respectively in contact with the rear surface of the first wiring part and the front surface of the second wiring part, the lateral edges running parallel to the wiring direction, and the barbs respectively facing the first wiring part and the second wiring part from the tips.

9. The method according to claim 1, wherein:

the one or more insulating substrates each include a first insulating substrate and a second insulating substrate, and the first circuit pattern is the first conductive plate on the first insulating substrate, and the second circuit pattern is the second conductive plate on the second insulating substrate.

10. A method for manufacturing a semiconductor module, the method comprising:

disposing, on a metal base, one or more insulating substrates each having, on a front surface thereof, a first conductive part, and a second conductive part having a different potential from the first conductive part;

disposing, on the metal base, a case including a first lead frame, a second lead frame, and a frame-like chassis that are integrally molded together, the first lead frame including a first wiring part that extends in parallel to the front surface of the one or more insulating substrates, and the second lead frame including a second wiring part that extends in a wiring direction of the first wiring part in such a manner as to overlap the first wiring part with a gap from a front surface of the first wiring part;

joining the first lead frame and the second lead frame to respectively the first conductive part and the second conductive part; and attaching, before the joining of the first lead frame and the second lead frame to the first conductive part and the second conductive part, respectively, one or more insulating members, each including a clamping part and a wiring gap part, in an attachment area provided in part of where the first wiring part and the second wiring part overlap each other, the clamping part sandwiching the first and second wiring parts at the attachment area from a rear surface of the first wiring part and a front surface of the second wiring part, and the wiring gap part filling the gap between the first and second wiring parts in the attachment area.

11. The method according to claim 10, wherein in each of the one or more insulating members, the clamping part includes a first portion in contact with the front surface of the second wiring part, a second portion in contact with the rear surface of the first wiring part, and a third portion connecting lateral parts of the first portion and the second portion, the lateral parts extending in parallel to the wiring direction and lying in a same plane, and a lateral part of the wiring gap part, which lies in the same plane as the lateral parts of the first portion and the second portion, is connected to the third portion.

12. The method according to claim 11, further comprising integrally molding the case before the disposing of the case on the metal base, wherein the attaching of the one or more insulating members to the attachment area is performed after the integrally molding of the case.

13. The method according to claim 11, further comprising:

detaching the one or more insulating members from the attachment area, and after the detaching the one or more insulating members, filling with a sealing member a housing area surrounded by the chassis.

14. The method according to claim 11, wherein:

the first lead frame or the second lead frame includes a third wiring part that projects parallel to the front surfaces of the first and second wiring parts from the first wiring part or the second wiring part, and the first portion or the second portion of the clamping part and the wiring gap part each include extension portions that sandwich the third wiring part therebetween.

15. The method according to claim 10, wherein the clamping part includes a first portion in contact with the front surface of the second wiring part, a second portion in contact with the rear surface of the first wiring part, a third portion connecting the first portion to a first end of the wiring gap part, and a fourth portion connecting the second portion to a second end of the wiring gap part that is opposite to the first end of the wiring gap part.

16. The method according to claim 15, further comprising integrally molding the case before the disposing of the case on the metal base, wherein the attaching of the one or more insulating members is performed before the integrally molding of the case.

17. The method according to claim 10, wherein the clamping part has barbs at tips of lateral edges of surfaces thereof that are respectively in contact with the rear surface of the first wiring part and the front surface of the second wiring part, the lateral edges run parallel to the wiring direction, and the barbs respectively face the first wiring part and the second wiring part from the tips.

18. The method according to claim 10, wherein:

the first conductive part is a first circuit pattern provided on the front surface of the one or more insulating substrates, or is a first main electrode on a front surface of a first semiconductor element provided on the front surface of the one or more insulating substrates, and the second conductive part is a second circuit pattern provided on the front surface of the one or more insulating substrates, or is a second main electrode on a front surface of a second semiconductor element provided on the front surface of the one or more insulating substrates.

* * * * *